United States Patent
Lim et al.

(10) Patent No.: US 10,010,016 B2
(45) Date of Patent: Jun. 26, 2018

(54) SHIELD CAN DEVICE FOR SHIELDING ELECTROMAGNETIC WAVE

(71) Applicant: Samsung Electronics Co., Ltd., Suwon-si (KR)

(72) Inventors: Jae-deok Lim, Hwaseong-si (KR); Jung-je Bang, Suwon-si (KR); Hyun-tae Jang, Seoul (KR); Hye-in Park, Seoul (KR); Jae-heung Ye, Suwon-si (KR); Chan-beom Jeong, Suwon-si (KR); Sae-bom Lee, Yongin-si (KR); Yong-won Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days. days.

(21) Appl. No.: 15/415,181

(22) Filed: Jan. 25, 2017

(65) Prior Publication Data
US 2017/0215306 A1     Jul. 27, 2017

(30) Foreign Application Priority Data
Jan. 27, 2016 (KR) ........................ 10-2016-0009876

(51) Int. Cl.
*H01R 4/64* (2006.01)
*H05K 9/00* (2006.01)

(52) U.S. Cl.
CPC ............ *H05K 9/0032* (2013.01); *H01R 4/64* (2013.01)

(58) Field of Classification Search
CPC ................ H05K 9/0032; H01R 4/64
USPC ........................................ 174/377; 361/818
See application file for complete search history.

(56) References Cited

U.S. PATENT DOCUMENTS

| | | | | |
|---|---|---|---|---|
| 4,697,044 A * | 9/1987 | Ishikawa | ................ | H05K 9/006 174/372 |
| 4,766,519 A * | 8/1988 | Heiland | ............... | H05K 5/0013 206/449 |
| 5,014,160 A * | 5/1991 | McCoy, Jr. | ............ | H05K 3/308 174/363 |
| 5,383,098 A * | 1/1995 | Ma | ........................ | H04B 1/3833 174/371 |
| 6,731,518 B2 * | 5/2004 | Suzuki | ................... | H05K 9/006 361/753 |
| 7,442,881 B1 * | 10/2008 | Chien | ................. | H05K 9/0032 174/377 |
| 7,903,431 B2 * | 3/2011 | English | ................ | H05K 9/0032 174/382 |

(Continued)

FOREIGN PATENT DOCUMENTS

| | | |
|---|---|---|
| JP | 2008-218526 | 9/2008 |
| JP | 2012-33725 | 2/2012 |

(Continued)

*Primary Examiner* — Timothy Thompson
*Assistant Examiner* — Michael F McAllister
(74) *Attorney, Agent, or Firm* — Staas & Halsey LLP (57) ABSTRACT

A shield can device is provided. The shield can device includes a frame which is fixed to a printed circuit board (PCB) and surrounds at least one circuit device as an electromagnetic shielding target, a cover which is coupled to the frame and closes an opening formed in a top of the frame, and a plurality of contact projections which are formed between the frame and the cover and allow the frame and the cover to be in electrical contact with each other.

15 Claims, 11 Drawing Sheets

(56) References Cited

U.S. PATENT DOCUMENTS

| | | | |
|---|---|---|---|
| 7,926,166 B2* | 4/2011 | Zuehlsdorf | H04B 1/40 174/372 |
| 7,952,889 B2* | 5/2011 | Chao | H05K 1/144 174/350 |
| 8,247,707 B2 | 8/2012 | Li | |
| 2002/0126466 A1* | 9/2002 | Suzuki | H05K 9/006 361/818 |
| 2002/0185294 A1* | 12/2002 | Shlyakhtichman | H05K 9/0032 174/384 |
| 2005/0219832 A1* | 10/2005 | Pawlenko | H05K 5/0013 361/818 |
| 2013/0048369 A1* | 2/2013 | Malek | H05K 9/0032 174/377 |
| 2014/0063774 A1* | 3/2014 | Samuels | H05K 9/0032 361/818 |
| 2015/0245543 A1 | 8/2015 | Jang et al. | |

FOREIGN PATENT DOCUMENTS

| | | |
|---|---|---|
| KR | 10-0649491 | 11/2006 |
| KR | 10-2009-0131976 | 12/2009 |
| KR | 10-2011-0027985 | 3/2011 |
| KR | 10-2013-0011241 | 1/2013 |
| KR | 10-1415306 | 6/2014 |

* cited by examiner

SHIELD CAN DEVICE FOR SHIELDING ELECTROMAGNETIC WAVE

CROSS-REFERENCE TO RELATED APPLICATIONS

This application claims priority from Korean Patent Application No. 10-2016-0009876, filed on Jan. 27, 2016, in the Korean Intellectual Property Office, the disclosure of which is incorporated herein by reference in its entirety.

BACKGROUND OF THE INVENTION

Field of the Invention

Apparatuses and methods consistent with exemplary embodiments relate to a shield can apparatus, and more particularly, to a shield can device for shielding radioactive noise of electronic parts mounted on a printed circuit board (PCB).

Description of the Related Art

In general, in response to various types of electronic apparatuses or communication apparatuses such as portable wireless terminals or digital cameras being used, electromagnetic waves may be generated in electronic parts provided in the electronic apparatuses or the communication apparatuses, and the electromagnetic wave generated in the electronic parts may be strictly regulated. The electromagnetic wave may be usefully used like wireless communication or radar, but the electromagnetic wave may adversely affect operations of the electronic apparatuses and may serve as a harmful factor to the body. Electromagnetic compatibility (EMC) for determining whether or not the electromagnetic wave is suitable for user environments should be compulsorily tested with respect to the various electronic apparatuses or communication apparatuses. The EMC may be divided into electromagnetic interference (EMI) due to radioactive noise and electromagnetic susceptibility (EMS) for shielding the electromagnetic wave harmful to the body and may be thoroughly regulated.

The harmful electromagnetic wave or interference electromagnetic wave generated in the electronic parts may be blocked through a certain shield can which covers the electronic parts mounted on the PCB inside the electronic apparatus, and thus the electromagnetic wave may not affect the electronic apparatus itself and the operations of other electronic apparatuses.

The shield can may typically have a bottom-opened box shape to cove the electronic parts. The shield can may be installed on the PCB through a clip for fixing the shield can coupled to the PCB to clamp a sidewall of the shield can. In general, in a state that the shield can is installed by inserting the clip having an inserting portion into each of a plurality of coupling holes formed in the PCB, the shield can having one side-opened box shape may be inserted into and locked to the inserting portion of the clip and thus the electronic parts located in the inside of the shield can may be shielded.

However, in response to a lot of clips being installed in the PCB, the detachment/attachment of the shield can may be difficult and a failure rate in mass production may be increased. Further, it takes a long time to mount the shield can due to considerably uncomfortable tasks such as dense installation and assembly of the clip. In response to the communication apparatuses or electronic apparatuses being fallen, any one of the shield can and the clip installed in the PCB may be detached due to shocks and thus the fixed state to the PCB may be poor.

As the fixed state is further poor and the shield can is locked and fixed to the inserting portion of the clip installed in the PCB, a gap may be formed by a thickness of the clip located between the shield can and the PCB, and the shield efficiency may be degraded due to the harmful electromagnetic wave or the interference electromagnetic wave irradiated through the gap between the shield can and the PCB.

As described above, it is difficult to improve the shielding performance through only a side clamping structure of the shield can.

SUMMARY OF THE INVENTION

Exemplary embodiments may overcome the above disadvantages and other disadvantages not described above. Also, an exemplary embodiment is not required to overcome the disadvantages described above, and an exemplary embodiment may not overcome any of the problems described above.

One or more exemplary embodiments relate to a shield can structure capable of improving electromagnetic shielding performance of a shield can device and ensuring stable shielding performance with respect to an external shock by improving a coupling structure between a cover and a frame constituting the shield can device.

According to an aspect of an exemplary embodiment, there is provided a shield can device including a frame which is fixed to a printed circuit board (PCB) and surrounds at least one circuit device as an electromagnetic shielding target; a cover which is coupled to the frame and closes an opening formed in a top of the frame; and a plurality of contact projections which are formed between the frame and the cover and allow the frame and the cover to be in electrical contact with each other.

According to an aspect of an exemplary embodiment, there is provided a closed-loop type frame which is fixed to a printed circuit board (PCB) and surrounds at least one circuit device; a cover which covers an opening formed in a top of the frame; a snap-coupling structure which mutually couples the frame and the cover; and a plurality of contact projections formed in a bottom of the cover or a portion of the frame which faces the bottom of the cover.

Additional aspects and advantages of the exemplary embodiments are set forth in the detailed description, and will be obvious from the detailed description, or may be learned by practicing the exemplary embodiments.

BRIEF DESCRIPTION OF THE DRAWING FIGURES

The above and/or other aspects of the present invention will be more apparent by describing certain exemplary embodiments of the present invention with reference to the accompanying drawings, in which.

DETAILED DESCRIPTION OF THE
EXEMPLARY EMBODIMENTS

Hereinafter, the exemplary embodiments are described in greater detail with reference to the accompanying drawings. The matters defined in the description, such as detailed construction and elements, are provided to assist in a comprehensive understanding of the exemplary embodiments. Thus, it is understood that the exemplary embodiments can be carried out without those specifically defined matters.

Various embodiments will now be described more fully with reference to the accompanying drawings in which some embodiments are shown. The techniques described herein are exemplary, and should not be construed as implying any particular limitation on the present disclosure. It should be understood that various alternatives, combinations and modifications could be devised by those skilled in the art. In the following description, unless otherwise described, the same reference numerals are used for the same elements when they are depicted in different drawings.

Figure 1:
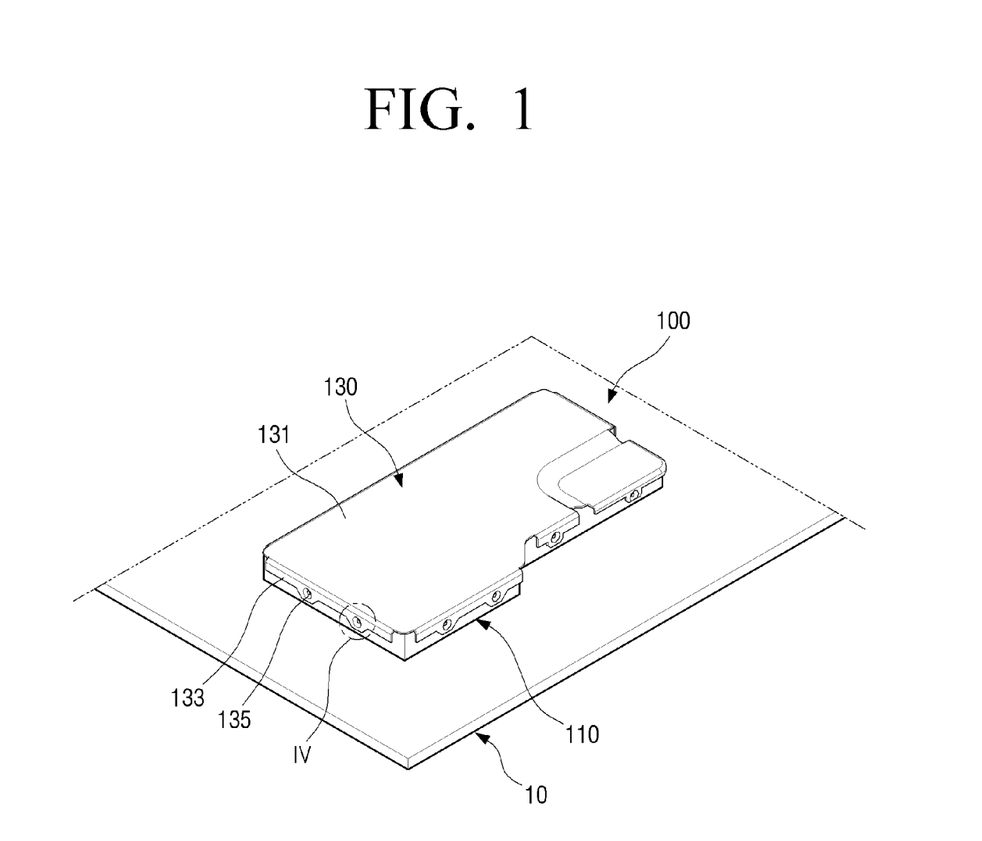
FIG. 1 is a coupling perspective view illustrating a shield can device according to an exemplary embodiment.
Figure 2:
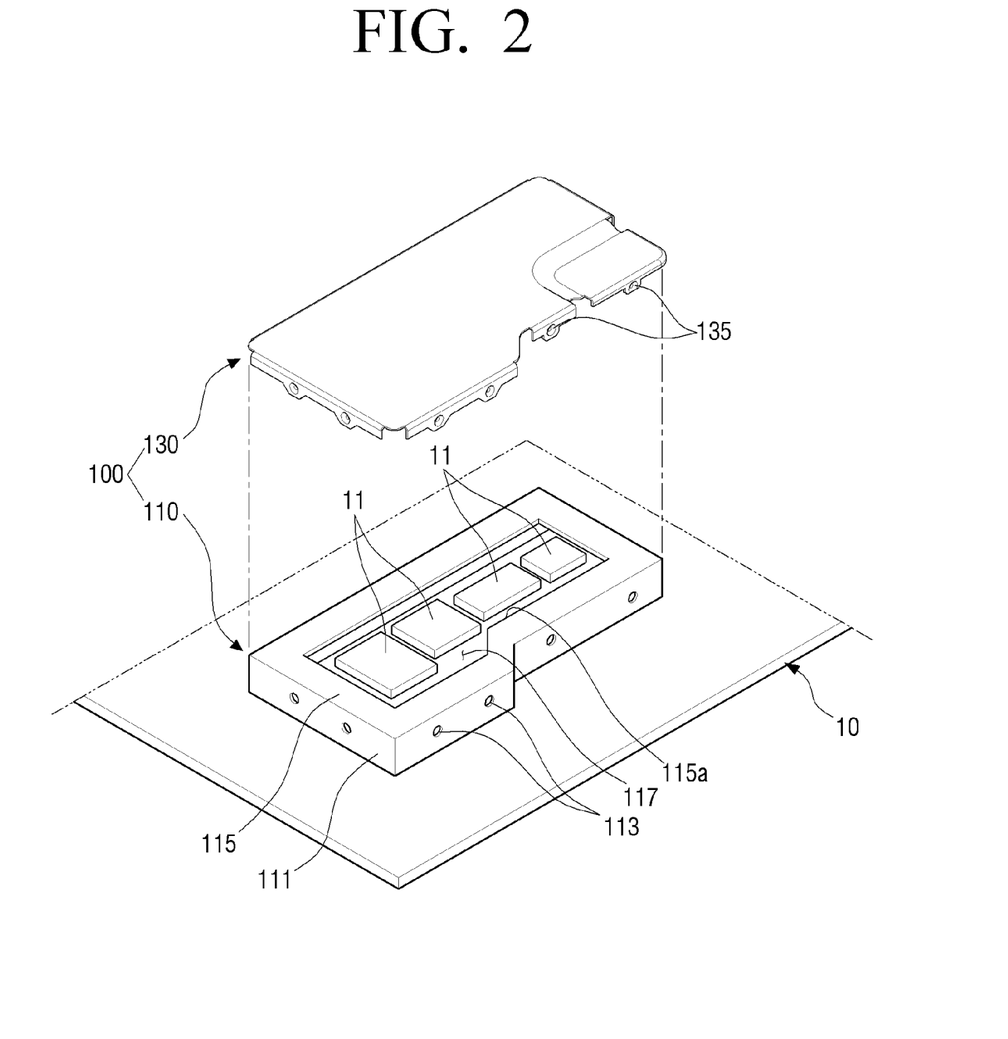
FIG. 2 is an exploded perspective view illustrating a shield can device according to an exemplary embodiment.

FIGS. 1 and 2 are a coupling perspective view and an exploded perspective view illustrating a shield can device according to an exemplary embodiment.

Referring to FIGS. 1 and 2, a shield can device 100 may be fixed to a printed circuit board (PCB) 10 to block a plurality of circuit devices 11 mounted on the PCB 10. The shield can device 100 may simultaneously block the plurality of circuit devices 11 as illustrated in FIG. 2, but this is not limited thereto and the shield can device 100 may block only a single circuit device.

The shield can device 100 may include a frame 110 and a cover 130 coupled to the frame 110. The frame 110 and the cover 130 may be formed of a conductive metallic material for shielding the electromagnetic wave generated in the circuit device 11 and for forming a ground (GDN).

The frame 110 may be fixed to the PCB 10 and surround the at least one circuit device 11 as an electromagnetic shielding target in a closed loop form. The frame 110 may include a side portion 111 and a bent portion 115 which is bent by about 90 degrees toward an inner side of the side portion 111 from a top end of the side portion 111.

A plurality of coupling holes 113 may be formed in the side portion 111 at intervals. The plurality of coupling holes 113 may be coupled to a plurality of coupling projections 135 of the cover 130 to be described later. As the plurality of coupling projections 135 are coupled to the plurality of coupling holes 113, the cover 130 may be coupled to the frame 110.

As the bent portion 115 has a fixed width, an opening 117 of the frame 110 may be formed. A boundary between the bent portion 115 and the opening 117 may refer to an edge 115a of the frame 110. The bent portion 115 may be in contact with a plurality of contact projections 150 which protrude from a bottom surface 136 of the cover 130 to form a ground.

The cover 130 may include a plate portion 131 having an area which can entirely cover a top of the frame and a plurality of extension portions 133 which extend downwardly from side ends of the plate portion 131.

The plate portion 131 may close the opening 117 formed in the top of the frame 110 in response to the cover 130 and the frame 110 being coupled to each other.

The plurality of coupling projections 135 may be formed in the extension portion 133 at intervals. The plurality of coupling projections 135 may be coupled to the plurality of coupling holes 113 of the frame 110.

A coupling portion mutually coupled between the extension portion 133 and the frame 110 may include the plurality of coupling projections 135 and the plurality of coupling holes 113. As illustrated in FIG. 2, the coupling hole 113 of the coupling portion may be formed in an outer side surface of the frame 110 and the coupling projection 135 may be formed in the extension portion 133, but this is not limited thereto. The coupling projection 135 may be formed in the outer side surface of the frame 110 and the coupling hole 113 may be formed in the extension portion 133. As the plurality of coupling projections 135 are snap-coupled to the plurality of holes 113, the cover 130 may be coupled to the frame 110. The cover 130 may be coupled to the frame 110 to cover the opening 117 formed in the top of the frame 110 through the coupling portion.

Figure 3:
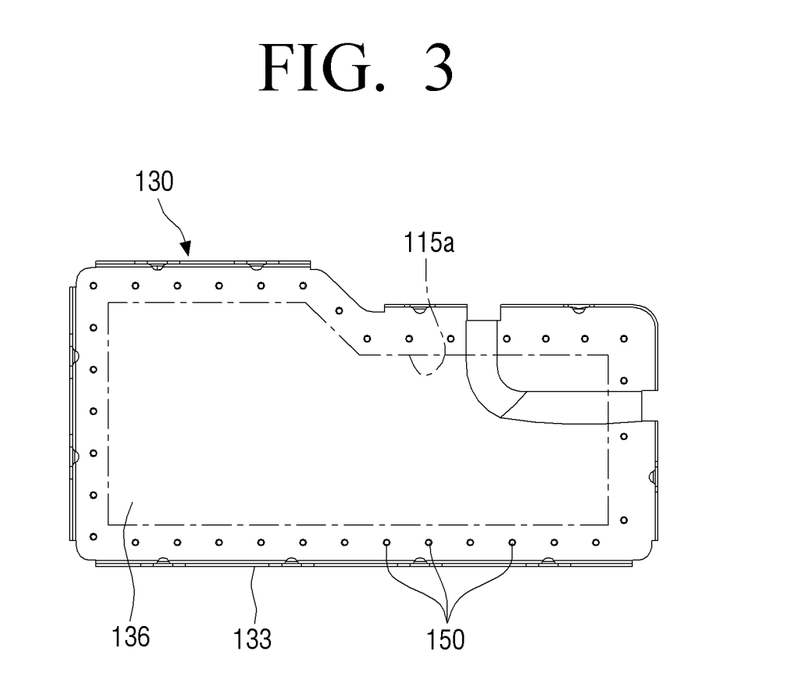
FIG. 3 is a rear view of a cover illustrated in FIG. 2.

FIG. 3 is a rear view of the cover illustrated in FIG. 2.

Referring to FIG. 3, the edge 115a is indicated by a dot-dash line to indicate a surface in which the bent portion 115 of the frame 110 and the bottom surface 136 of the cover 130 overlap in coupling of the frame 110 and the cover 130.

The plurality of contact projections 150 may be formed to protrude from the bottom surface 136 of the cover 130 facing the bent portion 115 of the frame 110 so that the plurality of contact projections 150 may be in contact with the frame 110 in the coupling of the frame 110 and the cover 130. The contact projection 150 may be in contact with a top surface 116 of the bent portion 115 to form a ground. The plurality of contact projections 150 may be arranged between the edge 115a and the extension portion 133 as illustrated in FIG. 3. The plurality of contact projections 150 may be arranged in a row at intervals and located close to the edge 115a.

Figure 4:
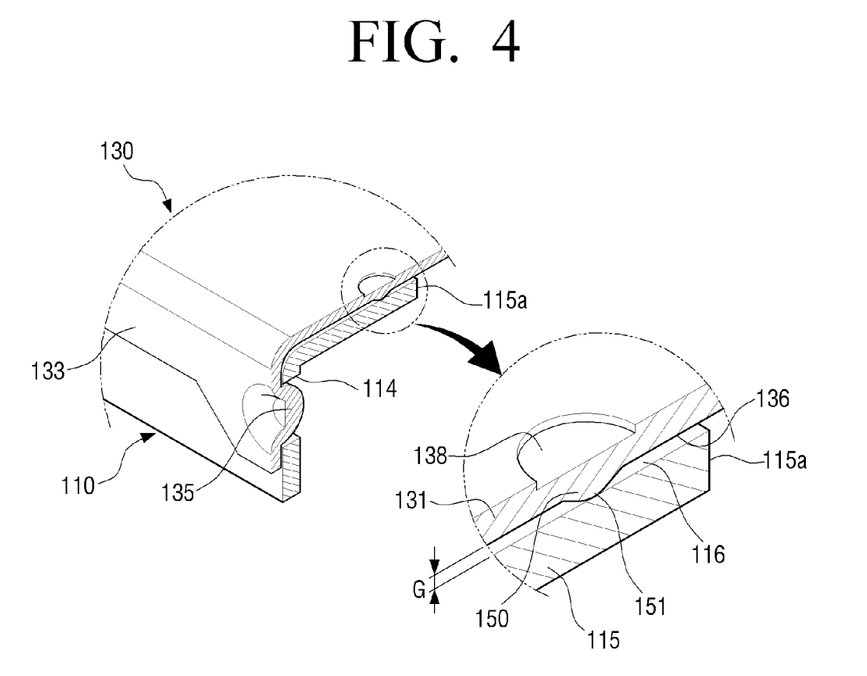
FIG. 4 is a partially enlarged cross-sectional diagram illustrating a portion IV indicated in FIG. 1.
Figure 5A:
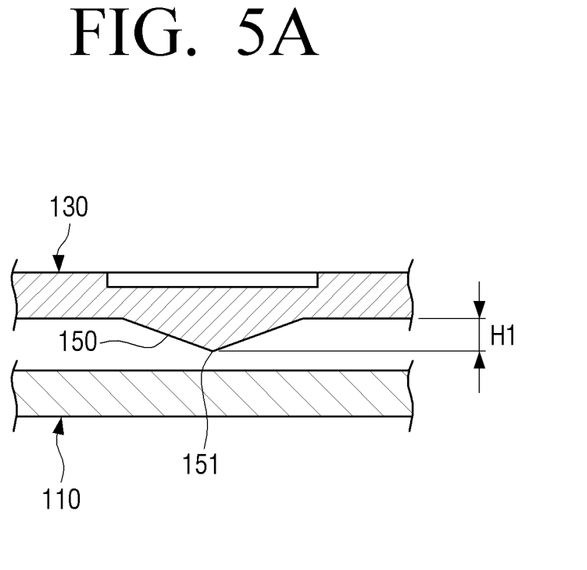
FIGS. 5A and 5B are cross-sectional diagrams illustrating a cover and a frame before and after coupling of a contact projection illustrated in FIG. 4.
Figure 5B:
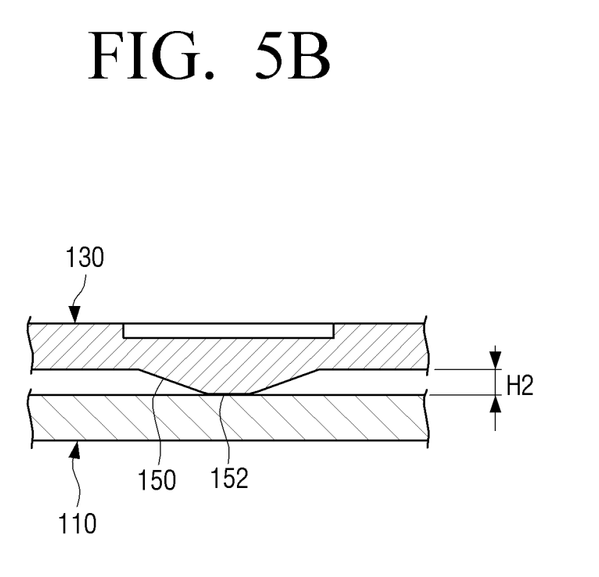

FIG. 4 is a partially enlarged cross-sectional diagram illustrating a portion VI indicated in FIG. 1, and FIGS. 5A and 5B are cross-sectional diagrams illustrating the cover and the frame before and after coupling of the contact projection illustrated in FIG. 4.

Referring to FIG. 4, it is impossible to be in surface contact between the cover 130 and the frame 110 without a gap between the frame 110 and the cover 130 in a manufacturing process of the shield can device 100, and thus a gap G may be formed between the plate portion 131 of the cover 130 and the bent portion 115 of the frame 110 in the coupling of the frame 110 and the cover 130. Accordingly, portions in which the plate portion 131 is not in electrical contact with the bent portion 115 may be largely formed. In the exemplary embodiment, in response to the cover 130 being coupled to the frame 110 as illustrated in FIG. 4, the coupling projection 135 of the cover 130 may be snap-coupled to the coupling hole 113 of the frame 110 and the plurality of contact projections 150 may be in contact with the top surface 116 of the bent portion 115 under a pressure state. Front tips 151 of the plurality of contact projections 150 may be slightly crushed to be in contact with the top surface 116 of the bent portion 115. Accordingly, the clearance or the manufacturing tolerance caused between the bent portion 115 of the frame 110 and the cover 130 is overcome, and thus the coupling between the frame 110 and the cover 130 may be further robust. The stable structure may be maintained through the coupling between the frame 110 and the cover 130 as described above even in response to the external shock being applied, and thus the high shielding performance may be ensured.

The electromagnetic shielding performance in the shield can device 100 in the exemplary embodiment may be improved as electrical conductivity is increased. As described above, the plurality of contact projections 150 may be in electrical contact with the bent portion 115 of the frame 110 and thus the electrical conductivity between the frame 110 and the cover 130 may be increased and the shielding performance of the shield can device 100 may be improved.

The plurality of contact projections 150 according to an exemplary embodiment may have a conical shape. A groove 138 may be formed in a pressing process for forming the contact projections 150. As illustrated in FIG. 4, the contact projection 150 may be formed through the pressing process, but the forming method of the contact projection 150 is not limited thereto. Each contact projection 150 may be formed to protrude from the bottom surface 136 of the cover 130 and the front tip 151 of the contact projection 150 may be in point contact with the top surface 116 of the bent portion 115. For example, to further improve the shielding performance of the shield can device 100, the plurality of contact projections 150 may be arranged to be in contact with the top surface 116 of the bent portion 115 in a position close to the edge 115a of the bent portion 115. While the contact projection is pressed in coupling of the contact projection 150 and the bent portion 115, the contact projection 150 may be deformed in such a manner that a vertex formed in the front tip 151 of the contact projection 150 is crushed to be in surface contact with the bent portion 115. The deformation of the contact projection will be described later with reference to FIG. 5.

With reference to the coupling portion of FIG. 4, the plurality of coupling projections 135 may be coupled to the plurality of coupling holes 113 and thus the cover 130 may be coupled to the frame 110. The coupling projection 135 may be coupled to be in contact with a portion 114 of an inner circumferential surface of the coupling hole 113. The number of contacts between the frame 110 and the cover 130 may be increased through the contact between the coupling projection 135 and the coupling hole 113, and thus the shielding performance of the shield can device 100 may be improved.

Referring to FIG. 5A, before the coupling of the frame 110 and the cover 130, the conical-shaped contact projection 150 formed to protrude from the bottom 136 of the cover 130 may have a first height H1 which extends to the vertex formed in the front tip 151 of the contact projection 150 in a state that the contact projection 150 is not in contact with the frame 110.

Referring to FIG. 5B, after the coupling of the frame 110 and the cover 130, while the vertex formed in the front tip 151 may be pressed, the contact projection 150 may be deformed in such a manner that the front tip 151 is crushed to form a contact surface 152 and thus the contact projection may be in surface contact with the frame 110 to form a ground. The contact projection 150 which is deformed to be in surface contact with a contact target may have a second height H2 smaller than the first height H1 which is a protruding height before the coupling.

Figure 8A:
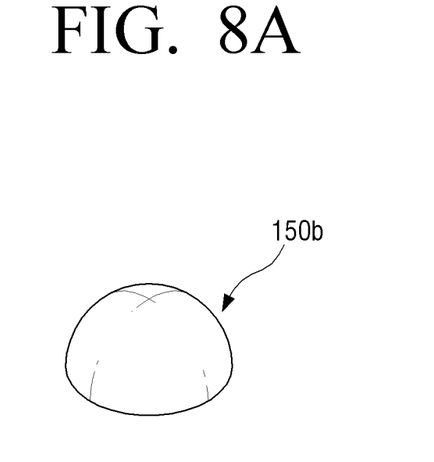
FIGS. 8A to 8C are diagrams illustrating various shapes of a contact projection according to exemplary embodiments.
Figure 8B:
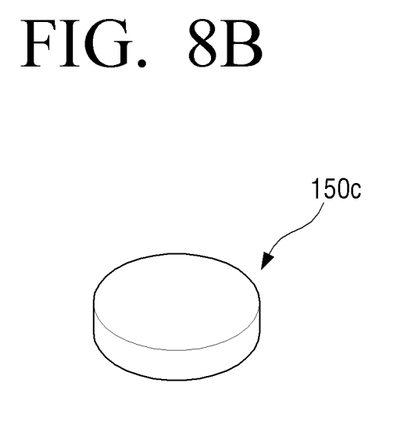
Figure 8C:
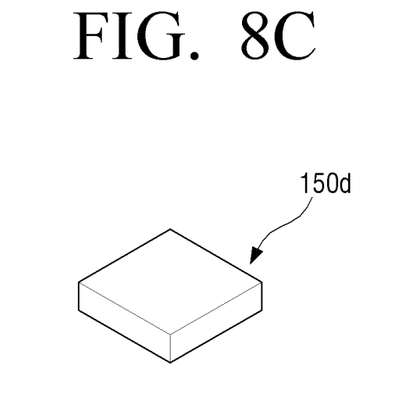

The contact projection 150 may have the conical shape, but the contact projection 150 may have various shapes as illustrated in FIGS. 8A to 8C to be described later.

Figure 6:
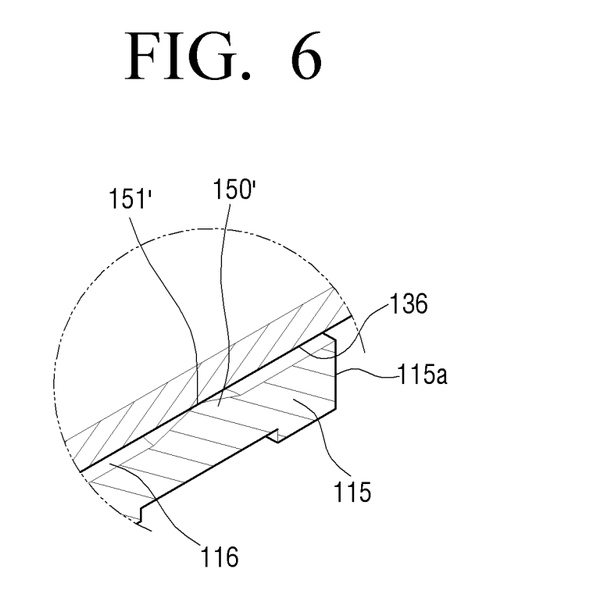
FIG. 6 is an enlarged cross-sectional diagram illustrating an example that a contact projection protrudes from a top surface of a bent portion of a frame according to an exemplary embodiment.

FIG. 6 is an enlarged cross-sectional view illustrating an example that a contact projection protrudes from a top surface of a bent portion of a frame according to an exemplary embodiment.

Referring to FIG. 6, a contact projection 150' may be formed to protrude from the top surface 116 of the bent portion 115 unlike the above-described contact projection 150. A plurality of contact projections 150' which protrude from the top surface 116 of the bent portion 115 may be in contact with the bottom surface 136 of the cover 130 to form a ground. The plurality of contact projections 150' may be arranged in a row at intervals along the bent portion 115. For example, the plurality of contact projections 150' may be arranged close to the edge 115a of the bent portion. While the plurality of contact projections 150' are pressed in the coupling with the cover 130, the plurality of contact projections 150' may be deformed in such a manner that a vertex formed in a front tip 151' may be crushed to be in surface contact with the bottom surface 136 of the cover 130.

Figure 7:
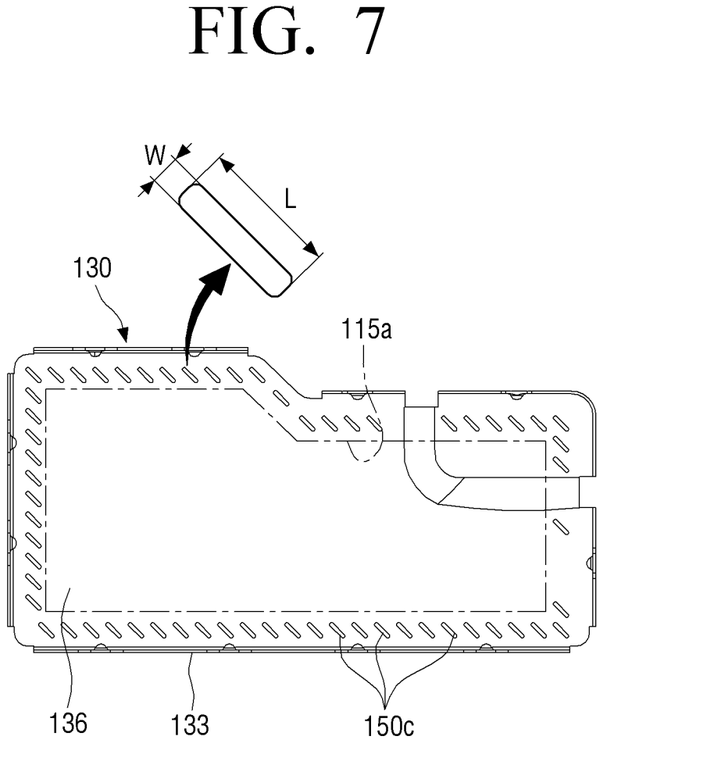
FIG. 7 is a rear view illustrating an example of a cover that a contact projection is arranged in a hatch form according to an exemplary embodiment.

FIG. 7 is a rear view illustrating an example of a cover that contact projections are arranged in a hatch form according to an exemplary embodiment.

Referring to FIG. 7, a plurality of contact projections 150a may be formed to have a rectangular shape of which a length L and a width W are formed to have different ratios. The plurality of contact projections 150a may be formed to be inclined at the same angle along the bent portion 115, and may be arranged at fixed intervals. For example, the plurality of contact projections 150a may be arranged in a hatch form. The plurality of contact projections 150a may be arranged close to the edge 115a of the bent portion 115 to improve the shielding performance of the shield can device 100. The plurality of contact projections 150a may be formed to protrude from the top surface 116 of the bent portion 115 or the bottom surface 136 of the cover 130.

FIGS. 8A to 8C are diagrams illustrating various shapes of a contact projection according to exemplary embodiments. The plurality of contact projections 150 may have the conical shape as described above, but the shape of the contact projection is not limited thereto and the contact projection may be formed in various shapes as illustrated in FIGS. 8A to 8C.

For example, as illustrated in FIG. 8A, a contact projection 150b may substantially have hemispherical shape and may be formed to a curved front tip. As illustrated in FIG. 8B, a contact projection 150c may have a flat disc shape and may be formed to have a flat front tip. As illustrated in FIG. 8C, a contact projection 150d may substantially have rectangular parallelepiped shape and may be formed to have a flat front tip.

As described above, the shield can device 100 according to an exemplary embodiment may form a plurality of contact projections which are formed between the frame 110 and the cover 130 and may allow the frame 110 and the cover 130 to be in electrical contact with each other. Accordingly, in response to the shield can device 100 being fixed to the PCB 10, the structural and electrical bonding force may be improved and thus the shielding performance may be improved. Further, the stable shielding performance may be ensured due to the contact of the contact projection 150 even in response to the external shock being applied.

It has been illustrated in the exemplary embodiments that the frame and the cover may have a polygonal shape that one-side cross-section is larger than the other-side cross-section, but this is only exemplary. For example, the shapes of the frame and the cover may be variously changed according to a shape of the PCB or a size, a shape, the number, an arrangement pattern, and the like of a circuit part mounted on the PCB. For example, the frame may have various shapes such as a rectangular shape, a square shape, a trapezoidal shape.

It has been illustrated in the examples that the frame and the cover are designed to have sizes corresponding to each other, but the frame and the cover may be designed so that the size of the cover is slightly larger or smaller than the size of the frame.

It has been described in the examples that the contact projections are arranged in a row on the bent portion of the frame, but the contact projections may not be necessarily arranged in this manner. For example, the contact projections may be arranged in two or more rows to further improve the shielding performed.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A shield can device comprising:
   a frame which is fixed to a printed circuit board (PCB) and surrounds at least one circuit device;
   a cover which is coupled to the frame and closes an opening formed in a top of the frame; and
   a plurality of contact projections, which are formed between the cover and a bent portion of the frame, the bent portion of the frame being formed to face the cover and to surround the opening, the plurality of contact portions being configured to allow the frame and the cover to be in electrical contact with each other.

2. The shield can device as claimed in claim 1, wherein the plurality of contact projections protrude from a top surface of the bent portion or a bottom surface of the cover.

3. The shield can device as claimed in claim 2, wherein the plurality of contact projections are located close to an edge of the bent portion.

4. The shield can device as claimed in claim 2, wherein the plurality of contact projections are in point contact with a contact target.

5. The shield can device as claimed in claim 2, wherein the plurality of contact projections has a conical shape.

6. The shield can device as claimed in claim 5, wherein while the plurality of contact projections are pressed in response to the contact projection being in contact with a contact target, the plurality of contact projections are deformed in such a manner that a front tip of each contact projection is in surface contact with the contact target.

7. The shield can device as claimed in claim 2, wherein the plurality of contact projections are formed to have a flat front tip or a curved front tip.

8. The shield can device as claimed in claim 2, wherein the plurality of contact projections are formed to have a rectangular front tip.

9. The shield can device as claimed in claim 2, wherein the plurality of contact projections are arranged at fixed intervals to be inclined at the same angle along the bent portion.

10. The shield can device as claimed in claim 1, wherein the cover includes an extension portion which extends a side end thereof, and
    the shield can device further comprising a coupling portion mutually coupled between the extension portion and the frame.

11. The shield can device as claimed in claim 10, wherein the coupling portion includes:
    a coupling projection formed in any one of an inner surface of the extension portion and an outer surface of the frame; and
    a coupling hole which is formed in the other of the inner surface of the extension portion and the outer surface of the frame and the coupling projection is coupled to be in contact therewith.

12. A shield can device comprising:
    a closed-loop type frame which is fixed to a printed circuit board (PCB) and surrounds at least one circuit device;
    a cover which covers an opening formed in a top of the frame;
    a snap-coupling structure which mutually couples the frame and the cover; and
    a plurality of contact projections formed on a bottom of the cover or on a bent portion of the frame, which is formed to face the bottom of the cover and to surround the opening.

13. The shield can device as claimed in claim 12, wherein the plurality of contact projections are arranged in a row at intervals along the bent portion of the frame.

14. The shield can device as claimed in claim 13, wherein the plurality of contact projections are arranged close to an edge of the bent portion.

15. The shield can device as claimed in claim 12, wherein the plurality of contact projections have a conical shape or a hemispherical shape.

* * * * *